US009667196B2

(12) United States Patent
Midya

(10) Patent No.: US 9,667,196 B2
(45) Date of Patent: May 30, 2017

(54) ENVELOPE TRACKING POWER CONVERTER

(75) Inventor: Pallab Midya, Palatine, IL (US)

(73) Assignee: ADX Research, Inc., Schaumburg, IL (US)

( * ) Notice: Subject to any disclaimer, the term of this patent is extended or adjusted under 35 U.S.C. 154(b) by 153 days.

(21) Appl. No.: 13/407,506

(22) Filed: Feb. 28, 2012

(65) Prior Publication Data
US 2016/0380597 A1    Dec. 29, 2016

(51) Int. Cl.
H03F 1/02         (2006.01)
H03F 3/24         (2006.01)
H03F 3/195        (2006.01)
H02M 3/158        (2006.01)

(52) U.S. Cl.
CPC .......... *H03F 1/0238* (2013.01); *H02M 3/158* (2013.01); *H03F 3/195* (2013.01); *H03F 3/245* (2013.01); *H03F 2200/102* (2013.01); *H03F 2200/351* (2013.01); *H03F 2200/451* (2013.01); *H03F 2200/78* (2013.01)

(58) Field of Classification Search
CPC ..................................................... H03F 1/0238
USPC ................................................ 330/127, 297
See application file for complete search history.

(56) References Cited

U.S. PATENT DOCUMENTS

| 7,336,056 | B1* | 2/2008 | Dening ................. | H02M 3/157 323/222 |
| 7,391,190 | B1* | 6/2008 | Rajagopalan ....... | H02M 3/1582 323/225 |
| 7,495,423 | B1* | 2/2009 | Knight ................ | H02M 3/1588 323/259 |
| 8,598,950 | B2* | 12/2013 | Khesbak .............. | H03F 1/0222 330/10 |
| 8,957,645 | B2* | 2/2015 | Glovinski .............. | H02M 1/34 323/225 |
| 2008/0278136 | A1* | 11/2008 | Murtojarvi .......... | H02M 3/1584 323/299 |

* cited by examiner

*Primary Examiner* — Patricia T Nguyen
(74) *Attorney, Agent, or Firm* — Jimmie Kirk Tolliver

(57) ABSTRACT

A tracking power converter for a radio frequency power amplifier includes a boost converter circuit, a switching network circuit, a filter circuit, and a controller circuit. The boost converter circuit provides a boosted voltage in response to a battery voltage. The switching network provides a switching signal in response to the boosted voltage, a first switch enable signal, a second switch enable signal, and a third switch enable signal. The filter circuit provides a power converter output voltage in response to the switching signal. The controller circuit provides the first switch enable signal, the second switch enable signal, and the third switch enable signal in response to a predetermined reference voltage, the switching voltage, the boosted voltage, and the battery voltage.

12 Claims, 5 Drawing Sheets

ENVELOPE TRACKING POWER CONVERTER

FIELD

This disclosure relates generally to power converters, and more specifically to envelope tracking power converters.

BACKGROUND

Radio frequency (RF) transmitters in wireless communication devices consume a large portion of power. More specifically, RF transmitters have to transmit and therefore, consume a large portion power. Efficient use of the RF spectrum requires the use of RF signals with variable envelope and phase. These signals are typically produced with high linearity using class AB amplifiers, which are inefficient. Variations in battery voltages from charged to discharged make the class AB amplifier even less efficient. The class AB amplifier has to be biased such that it can provide the peak power without clipping at the lowest battery voltage. Consequently, at the highest battery voltage the efficiency is lowered even for peak-power output.

In one known technique, a cascaded buck and boost converter is used. The control operates in a manner that the converter is either in buck or boost (BOB) mode on a cycle-by-cycle basis. It transitions between the modes to modulate the power supply of a variable envelope RF power amplifier. While this technique is an improvement over the class AB amplifier, it is desirable to increase efficiency and tracking bandwidth.

As such, it is desirable to provide a method and apparatus that tracks envelopes of RF signals in a more efficient manner. It is also desirable to provide a method and apparatus that exhibits an increased RF envelop tracking bandwidth.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
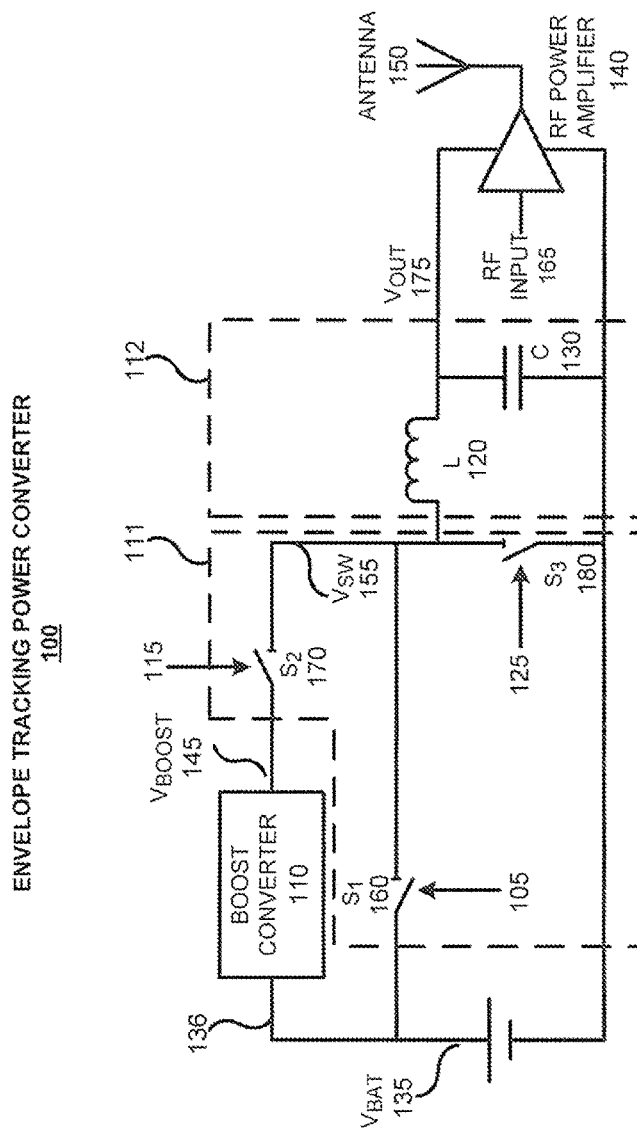
FIG. 1 is an example of an envelope tracking power converter circuit.

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

As used herein, the term "circuit" and/or "module" can include an electronic circuit, one or more processors (e.g., shared, dedicated, or group of processors such as but not limited to microprocessors, digital signal processors, or central processing units) and memory that execute one or more software or firmware programs, combinational logic circuits, an application specific integrated circuit, and/or other suitable components that provide the described functionality. Additionally, as will be appreciated by those of ordinary skill in the art, one or more circuits can be combined in an integrated circuit if desired. Furthermore, the term "signal" may refer to one or more currents, one or more voltages, or a data signal.

In one example, a tracking power converter for a radio frequency power amplifier includes a boost converter circuit, a switching network circuit, a filter circuit, and a controller circuit. The boost converter circuit provides a boosted voltage in response to a battery voltage. The switching network provides a switching signal in response to the boosted voltage, a first switch enable signal, a second switch enable signal, and a third switch enable signal. The filter circuit provides a power converter output voltage in response to the switching signal. The controller circuit provides the first switch enable signal, the second switch enable signal, and the third switch enable signal in response to a predetermined reference voltage, the switching voltage, the boosted voltage, and the battery voltage.

The disclosed method and apparatus provide an improved envelope tracking power supply that produces a voltage both lower and higher than an input battery voltage. In addition, the method and apparatus provide improved efficiency and bandwidth tracking over known techniques. Other advantages will be recognized by those of ordinary skill in the art.

Referring now to FIG. 1, an example of an envelope tracking power converter circuit 100 according to the present disclosure is depicted. In this example, the envelope tracking power converter circuit 100 includes a boost converter circuit 110, a switching network circuit 111, a filter circuit 112, and a radio frequency (RF) power amplifier circuit 140 configured as shown. As shown, a battery 135 can be coupled to the boost converter circuit 110 and the switching network circuit 111. Also, as shown, an RF antenna 150 can be coupled to the RF power amplifier circuit 140.

The switching network circuit 111 includes a first switch 160, a second switch 170, and a third switch 180 substantially configured as shown. The first, second, and third switches 160, 170, 180 can each comprise any suitable transistor (or combination thereof) capable of blocking voltage in both directions such as, for example, a Gallium Nitride (GaN) transistor and/or other suitable transistor.

In this example, the filter circuit 112 operates as a low pass filter. As such, in this example, the filter circuit 112 includes an inductance circuit 120 and a capacitance circuit 130 substantially configured as shown. In one example, the inductance circuit 120 can have an inductance of 50 nH and the capacitance circuit 130 can have a capacitance of 2 nF. Other inductance and capacitance values are contemplated. Additionally, a higher order filter can be used if desired.

The boost converter circuit 110 provides a boosted voltage 145 in response to a battery voltage 136 from the battery 135. The boosted voltage 145 is greater than the battery voltage 136. In one example, the boost converter circuit 110 can comprise any known boost converter such as, for example, a conventional boost converter producing 5V output and/or other suitable boost converter.

The switching network circuit 111 provides a switching voltage 155 in response to the boosted voltage 145. More specifically, the first switch 160 opens and closes in response to a first switch enable signal 105, the second switch 170 opens and closes in response to a second switch enable signal 115, and the third switch 180 opens and closes in response to a third switch enable signal 125. In this example, "opens" refers to an operating condition where the switch is not substantially conducting current (e.g., an open circuit) and "closes" refers to an operation condition where the switch is substantially conducting current (e.g., a closed circuit). In one example, the switching voltage 145 can have a voltage substantially equal to zero, substantially equal to the battery voltage 136, or substantially equal to the boosted voltage 145 based on the switching of the switching network 111.

The filter circuit 112 provides a power converter output voltage 175 in response to the switching voltage 155. More specifically, the filter circuit 112 filters the switching voltage 155 to provide the power converter output voltage 175. The power converter output voltage 175 provides power to the RF power amplifier circuit 140. The RF power amplifier circuit 140 drives the antenna 150 in response to an RF input signal 165 and based on the power converter output voltage 175.

Figure 2:
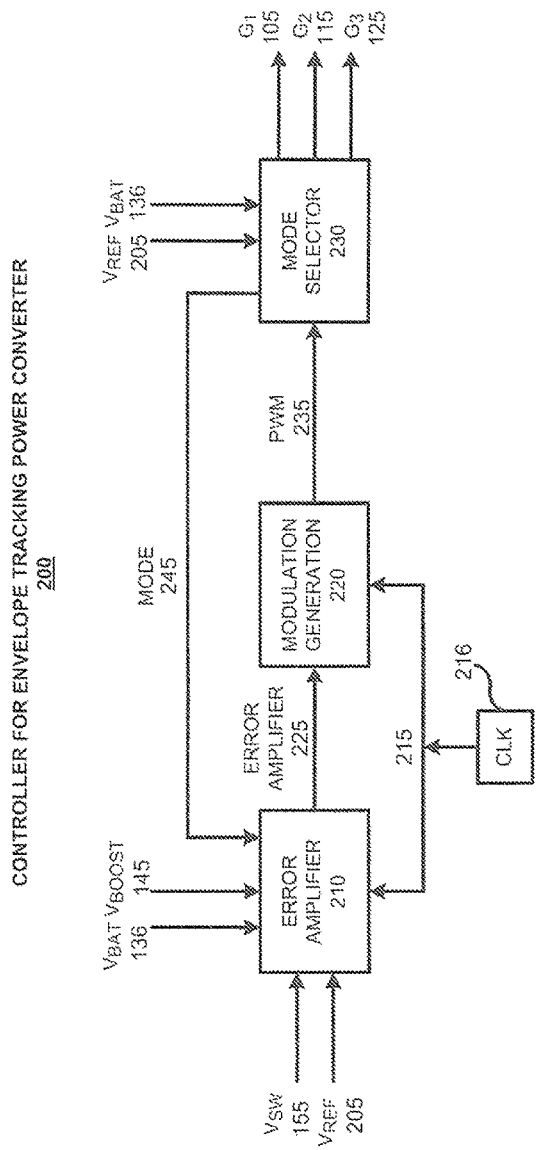
FIG. 2 is an example of a controller circuit for controlling the envelope tracking power converter circuit.

Referring now to FIG. 2, an example of a controller circuit 200 for controlling the envelope tracking power converter 100 is depicted. In this example, the controller circuit 200 includes an error amplifier circuit 210, a modulation generation circuit 220, and a mode selector circuit 230 substantially configured as shown.

The error amplifier circuit 210 provides an error amplifier signal 225 in response to the battery voltage 136, the switching voltage 145, the switching voltage 155, a reference voltage 205, a clock signal 215 (e.g., from a clock circuit 216), and a mode signal 245. The reference voltage 205 can be a predetermined value produced by the circuitry that produces the RF input. In one example, the reference voltage 205 can be half of the battery voltage although other positive voltage values are contemplated that are below and above the battery voltage.

The modulation generation circuit 220 provides a modulated signal 235 in response to the clock signal 215 and the error amplifier signal 225. In one example, the modulated signal 235 can be pulse width modulated (PWM).

The mode selector circuit 230 provides the first switch enable signal 105, the second switch enable signal 115, the third switch enable signal 125, and the mode signal 245 in response to the modulated signal 235, the reference voltage 205, and the battery voltage 136.

Figure 3:
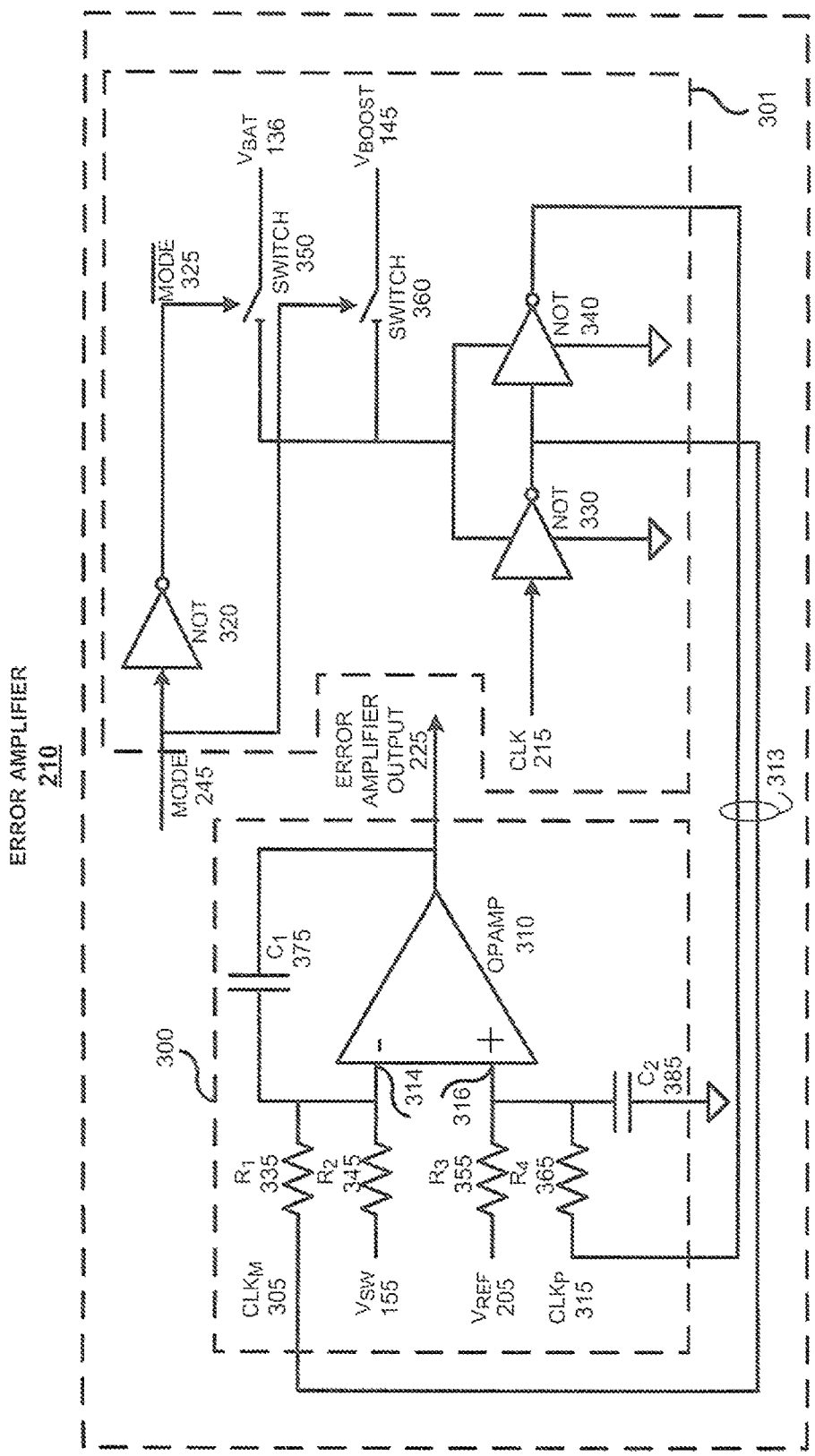
FIG. 3 is an example of an error amplifier circuit of the controller circuit.

Referring now to FIG. 3, an example of the error amplifier circuit 210 is depicted. In this example, the error amplifier circuit 210 includes an amplifier circuit 300 and a logic circuit 301. The logic circuit 301 provides an amplifier control signal 313 in response to the mode signal 245, the battery voltage 136, and the boosted voltage 145. More specifically, the logic circuit 301 produces a pair of signals 313 that are complementary logic signals with 50% duty ratio switching at a desired PWM frequency and amplitude substantially equal to the battery voltage 136 or the boost converter output voltage 145.

In response the amplifier control signal 213, the amplifier circuit 300 provides the error amplifier signal 225. More specifically, the error amplifier circuit 300 produces a signal proportional to the integral of the difference of the reference voltage $V_{REF}$ 205 and the switching voltage $V_{SW}$ 155 and the difference of the $CLK_P$ 315 and $CLK_M$ 305.

In this example, the logic circuit 301 includes a first inverter circuit 320, a second inverter circuit 330, a third inverter circuit 340, switch SW1 350, and switch SW2 360 substantially configured as shown. The first inverter circuit 320 provides an inverted mode signal 325 in response to the mode signal 245. As known in the art, the inverted mode signal 325 is complementary to the mode signal 245. As shown, the mode signal 245 and inverted mode signal 325 control the opening and closing of switch SW2 360 and switch SW1 350, respectively. As such, when the inverted mode signal 345 is a logical high, switch SW1 350 is closed and the battery voltage 136 provides power to the second inverter circuit 330 and the third NOT circuit 340. When the mode signal 245 is a logical high, switch SW2 360 is closed and the boosted voltage 145 provides power to the second inverter 330 and the third inverter 340.

The second inverter 330 provides an inverted clock signal 315 in response to the clock signal 215. The third inverter 340 provides a non-inverted clock signal 305 in response to the inverted clock signal 315. Accordingly, the inverted clock signal 315 and the non-inverted clock signal 305 have an amplitude based on the mode signal 245. For example, if the mode signal 245 is a logical high (or the inverted mode signal is a logical low), the amplitude of the inverted clock signal 315 and the non-inverted clock signal 305 is approximately equal to the boosted voltage 145. Similarly, if the inverted mode signal 325 is a logical high (or the mode signal 245 is a logical low), the amplitude of the inverted clock signal 315 and the non-inverted clock signal 305 is approximately equal to the battery voltage 136.

In this example, the amplifier circuit 300 includes an operational amplifier circuit 310 that provides the error amplifier signal 225 based on the non-inverted clock signal 305, the inverted clock signal 315, the reference voltage 205, and the switching voltage 155. The operational amplifier circuit 310 also includes resistor R1 335, resistor R2 345, resistor R2 355, resistor R3 365, capacitor C1 375, and capacitor C2 385 substantially configured as shown.

As shown, resistor R1 335 provides a resisted version of the non-inverted clock signal 305 to a negative input 314 of the operational amplifier circuit 310. Resistor R2 345 provides a resisted version of the switching voltage 155 to the negative input 314 of the operational amplifier circuit 310. Resistor R3 355 provides a resisted version of the reference voltage 205 and to a positive input 316 of the operational amplifier circuit 310. Resistor R4 365 provides a resisted version of the inverted clock signal to the positive input 316 of the operational amplifier circuit 310.

In one example, capacitor C1 375 and capacitor C2 385 can be substantially equal in value such as, for example, 10 pF for a PWM frequency of 50 MHz. Other values are contemplated. Resistor R3 355 and resistor R2 345 can be substantially equal in value for a system with a gain of one for example. In another example, if a system with a gain of two is desired, resistor R3 355 can be substantially twice the value of resistor R2 345. Other values are contemplated. In one example, resistor R1 335 and resistor R4 365 can be substantially equal to each other and substantially twice the value of resistor R2 345, although other values are contemplated. In one example, where the amplifier control signal 313 has substantially half of the swing of the switching signal $V_{SW}$ 155, resistor R1 335 and resistor R4 365 can be half the value mentioned above. In one example, resistors R1 335, R2 345, R3 355, and R4 365 can have a value in the range of 1 kOhm to 10 kOhm for a switcher operating around 50 MHz. If the RC product is higher, it can limit the size of the error amplifier output 225 to stay out of saturation. However, if the RC product too high, the error amplifier output swing could be too low and the system may be subject to noise. Therefore, in one example, the RC product can be inversely proportional to the PWM switching frequency.

Although this example depicts a single ended implementation of an error amplifier, a differential implementation of an error amplifier can also be used if desired.

Figure 4:
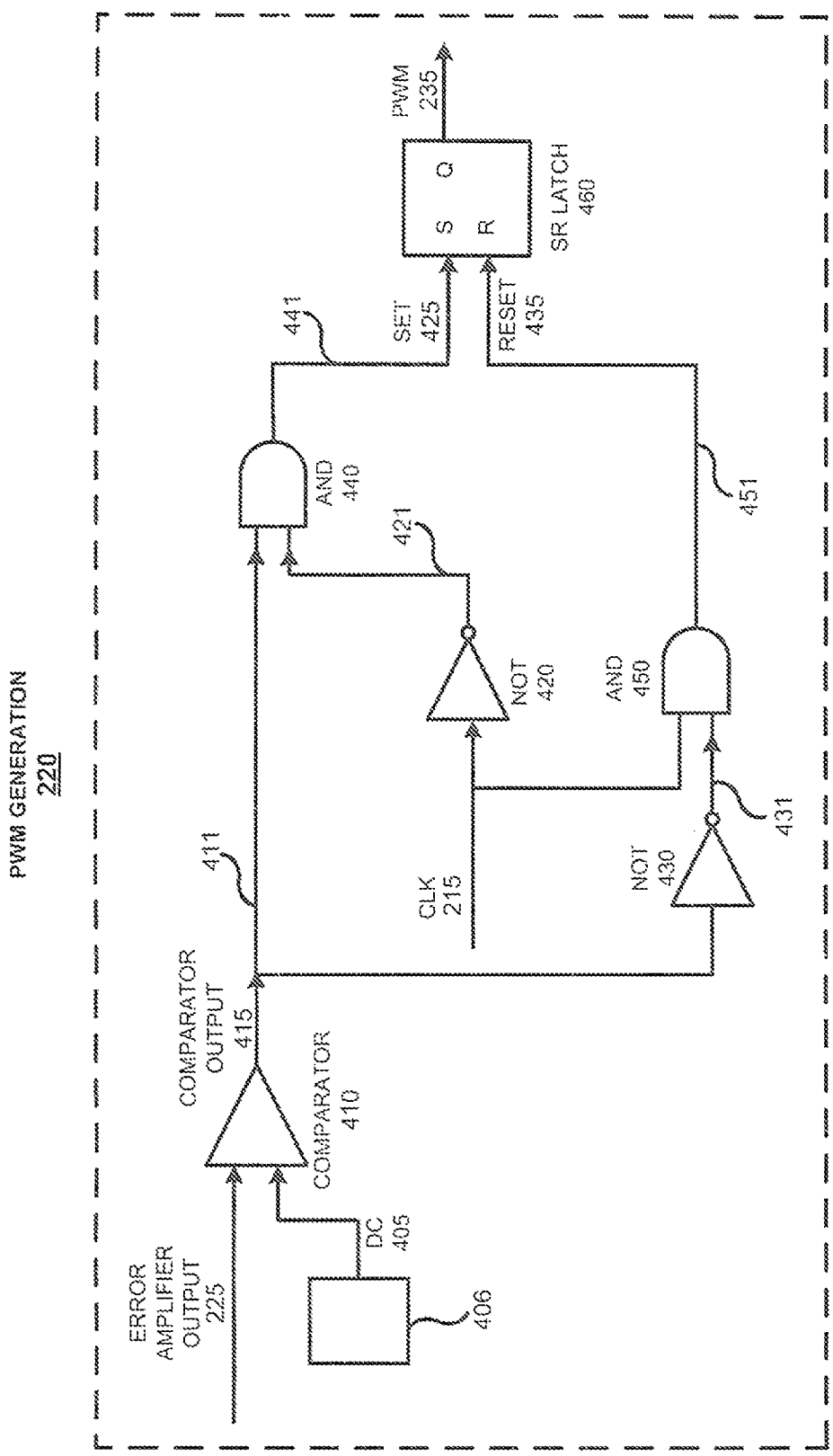
FIG. 4 is an example of a modulation generation circuit of the controller circuit.

Referring now to FIG. 4, an example of the modulation generation circuit 220 is depicted. In this example, the modulation generation circuit 220 includes a comparator circuit 410, a first inverter circuit 420, a second inverter circuit 430, a first logic circuit 440, a second logic circuit 450, and a latch circuit 460 substantially configured as shown. In this example, the first logic circuit 440 comprises an AND gate circuit, the second logic circuit 450 comprises an AND gate circuit, and the latch circuit 460 comprises an SR flip-flop circuit.

The comparator circuit 410 provides a comparison signal 411 in response to the error amplifier signal 225 and a predetermined value 405. More specifically, the comparator circuit 410 provides the comparison signal 411 based on a comparison of the error amplifier signal 225 and the predetermined value. The predetermined value 405 can be any suitable value such as, 0.9V or other suitable value. In one example, the predetermined value 405 can be stored as a voltage in a storage circuit 406. The storage circuit 406 can comprise any suitable circuit capable of storing the predetermined value such as a capacitor and/or a voltage regulator for example.

As noted above, in one example, the error amplifier 210 can be implemented as a differential manner. As such, in differential implementation example, the error amplifier signal 225 is a differential signal and thus the comparator circuit 410 provides the comparison signal 411 based on a comparison between a first and second signal of the differential signal.

The first inverter circuit 420 provides an inverted clock signal 421 in response to the clock signal 215. The first logic circuit 440 provides a set signal 441 in response to the comparison signal 411 and the inverted clock signal 421. More specifically, in this example, the first logic circuit 440 provides the set signal 411 based on a logical AND operation of the comparison signal 411 and the inverted clock signal 421.

The second inverter circuit 430 provides an inverted comparison signal 431 in response to the comparison signal 411. The second logic gate 450 provides a reset signal 451 in response to the clock signal 215 and the inverted comparison signal 431. More specifically, in this example, the second logic circuit 450 provides the reset signal 451 based on a logical AND operation of the clock signal 215 and the inverted comparison signal 431.

The latch circuit 460 provides the modulated signal 235 in response to the set signal 441 and the reset signal 451. As noted above, in one example, the latch circuit 460 can comprise an SR flip-flop as known in the art. As such, in this example, the modulated signal 235 can be provided based on the known operation of an SR flip-flop circuit.

One advantage of the configuration of the first and second inverter circuits 420, 430, the first and second logic circuits 440, 450, and the latch circuit 460 is to ensure that the modulated signal 235 is substantially at the same frequency as the clock signal 215 while allowing for a wide range of duty ratio based on the comparison signal 411.

Figure 5:
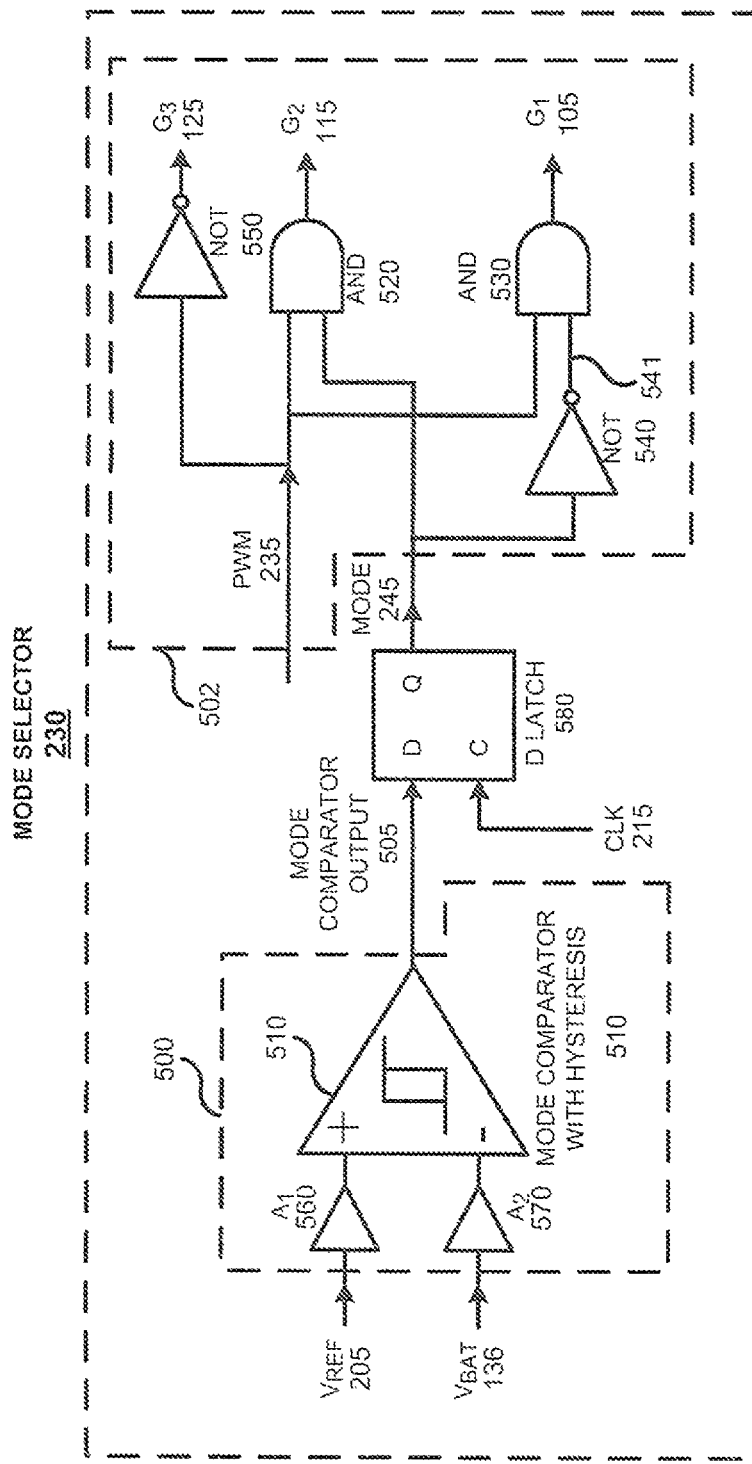
FIG. 5 is an example of the mode selector circuit of the controller circuit.

Referring now to FIG. 5, an example of the mode selector circuit 230 is depicted. In this example, the mode selector circuit 230 includes a comparison circuit 500 and a logic circuit 502 substantially configured as shown. The comparison circuit 500 provides the mode signal 245 in response to the reference voltage 205 and the battery voltage 136. More specifically, the comparison circuit 500 provides the mode signal 245 based on a comparison of the reference voltage 205 and the battery voltage 136.

In one example, the comparison circuit 500 can comprise a comparator circuit 510. In one example, the comparator circuit 510 can have hysteresis such that the output of the comparator does not switch at a high frequency. The comparison circuit 500 can also include a first buffer circuit 560 and a second buffer circuit 570. The first and second buffer circuits 560, 570 can be used to reduce the input range of the comparator circuit 510. As such, the first and second buffer circuits 560, 570 can scale the reference voltage 205 and the battery voltage 136, respectively, and can comprise any suitable attenuation circuit known in the art such as, for example, a resistor divider.

The logic circuit 502 provides the first switch enable signal 105, the second switch enable signal 115, and the third switch enable signal 125 in response to the mode signal 245 and the modulated signal 235. In this example, the logic circuit 502 includes a first inverter circuit 540, a second inverter circuit 550, a first logical operation circuit 520, and a second logical operation circuit 530 substantially configured as shown. In one example, the first and second logical operation circuits 520, 530 can each comprise a logical AND date circuit.

The second inverter circuit 550 provides the third switch enable signal 125 in response to the modulated signal 235. As such, in this example, the third switch enable signal 125 is a logical complement of the modulated signal 245 (e.g., the third switch enable signal 125 is an inverted version of the modulated signal 245).

The first inverter circuit 540 provides an inverted mode signal 541 in response to the mode signal 245. The first logical operation circuit 520 provides the second switch enable signal 115 in response to the modulated signal 235 and the mode signal 245. More specifically, in this example, the first logical operation circuit 520 provides the second switch enable signal 115 based on a logical AND operation of the modulated signal 235 and the mode signal 245.

The second logical operation circuit 530 provides the first switch enable signal 105 in response to the modulated signal 235 and the inverted mode signal 541. More specifically, in this example, the second logical operation circuit 530 provides the first switch enable signal 105 based on a logical AND operation of the modulated signal 235 and the inverted mode signal 541.

As noted above, among other advantages, the envelope tracking power converter circuit 100 provides a voltage both lower and higher than an input battery voltage. In addition, the method and apparatus provide improved efficiency and bandwidth tracking over known techniques. Other advantages will be recognized by those of ordinary skill in the art.

Although the disclosure is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

What is claimed is:

1. A tracking power converter for a radio frequency (RF) power amplifier, comprising:
    a boost converter circuit that is operative to provide a boosted voltage in response to a battery voltage;
    a switching network circuit that is operative to provide a switching signal in response to the boosted voltage, a first switch enable signal, a second switch enable signal, and a third switch enable signal;
    a filter circuit that is operative to provide a power converter output voltage in response to the switching signal; and
    a controller circuit that is operative to provide the first switch enable signal, the second switch enable signal, and the third switch enable signal in response to a predetermined reference voltage, the switching voltage, the boosted voltage, and the battery voltage.

2. The tracking power converter of claim 1 wherein the switching network circuit comprises a first switch that is operative to switch in response to the first switch enable signal, a second switch that is operative to switch in response to the second switch enable signal, and a third switch that is operative to switch in response to the third switch enable signal.

3. The tracking power converter of claim 2 wherein the first switch, the second switch, and the third switch each comprise a gallium nitride transistor.

4. The tracking power converter of claim 1 wherein the controller circuit comprises:
    an error amplifier circuit that is operative to provide an error amplifier signal in response to the switching voltage, the predetermined reference voltage, the battery voltage, the boosted voltage, a mode signal, and a clock;
    a modulation generation circuit that is operative to provide a modulated signal in response to the error amplifier signal and the clock signal;
    a mode selector circuit that is operative to provide the mode signal, the first switch enable signal, the second switch enable signal, and the third switch enable signal in response to the modulated signal, the predetermined reference voltage, and the battery voltage.

5. The tracking power converter of claim 4 wherein the error amplifier comprises:
    an operational amplifier having a first terminal, a second terminal, and a third terminal, wherein the third terminal provides the error amplifier signal;
    a first capacitor having a fourth terminal and a fifth terminal, wherein the fourth terminal is connected to the first terminal and the fifth terminal is operatively coupled to the third terminal;
    a second capacitor having a sixth terminal and a seventh terminal, wherein the sixth terminal is operatively coupled to the second terminal and the seventh terminal is operatively coupled to ground;
    a first resistor having an eight terminal and a ninth terminal, wherein the ninth terminal is operatively coupled to the fourth terminal;
    a second resistor having a tenth terminal and a eleventh terminal, wherein the tenth terminal receives the switching voltage and the eleventh terminal is operatively coupled to the first terminal;
    a third resistor having a twelfth terminal and a thirteenth terminal, wherein the twelfth terminal receives the reference voltage and the thirteenth terminal is operatively coupled to the second terminal;
    a fourth resistor having a fourteenth terminal and a fifteenth terminal, wherein the fifteenth terminal is operatively coupled to the second terminal;
    a first NOT gate having a sixteenth terminal and a seventeenth terminal, wherein the sixteenth terminal receives the mode signal;
    a second NOT gate having an eighteenth terminal, a nineteenth terminal, a first power terminal, and a second power terminal, wherein the eighteenth terminal receives the clock signal, the nineteenth terminal is operatively coupled to the eighteenth terminal, and the second power terminal is operatively coupled to ground;
    a third NOT gate having a twentieth terminal, a twenty-first terminal, a third power terminal, and a fourth power terminal, wherein the twentieth terminal is operatively coupled to the nineteenth terminal, the twenty-first terminal is operatively couple to the fourteenth terminal, and the fourth power terminal is operatively coupled to ground;
    a fourth switch having a twenty-second terminal, a twenty-third terminal, and a first enable terminal, wherein the twenty-second terminal is operatively coupled to the first power terminal, the twenty-third terminal is operatively coupled to the battery voltage, and the first enable terminal is operatively coupled to the seventeenth terminal; and
    a fifth switch having a twenty-fourth terminal, a twenty-fifth terminal, and a second enable terminal, wherein the twenty-fourth terminal is operatively coupled to the third power terminal and the twenty-second terminal, the twenty-fifth terminal is operatively coupled to the boost converter output voltage, and the second enable terminal is connected to the sixteenth terminal.

6. The tracking power converter of claim 4 wherein the modulation generation circuit comprises:
    a comparator circuit having a first terminal, a second terminal, and a third terminal, wherein the first terminal receives the error amplifier signal and the second terminal is operatively coupled to a predetermined voltage;
    a sixth NOT gate having a fourth terminal and a fifth terminal, wherein the fourth terminal receives the clock signal;
    a seventh NOT gate having a sixth terminal and a seventh terminal, wherein the sixth terminal is operatively coupled to the third terminal;
    a third AND gate having an eighth terminal, a ninth terminal, and a tenth terminal, wherein the eighth terminal is operatively coupled to the third terminal and the ninth terminal is operatively coupled to the fifth terminal;

a fourth AND gate having an eleventh terminal, a twelfth terminal, and a thirteenth terminal, wherein the eleventh terminal is operatively coupled to the fourth terminal and the twelfth terminal is operatively coupled to the seventh terminal; and a set-reset latch having a fourteenth terminal, a fifteenth terminal, and a sixteenth terminal, wherein the fourteenth terminal is operatively coupled to the tenth terminal, the fifteenth terminal is operatively coupled to the thirteenth terminal, and the sixteenth terminal provides the modulated signal.

7. The tracking power converter of claim 4 wherein the mode selector circuit comprises:

a first buffer that receives the reference voltage;

a second buffer that receives the battery voltage;

a first comparator with hysteresis having a first input terminal operatively coupled to a first buffer output terminal of the first buffer and a second input terminal operatively coupled to a second buffer output terminal of the second buffer;

a first NOT gate having a first terminal and a second terminal, wherein the first terminal is operatively coupled to a comparator output terminal of the comparator with hysteresis;

a first AND gate having a third terminal, a fourth terminal, and a fifth terminal, wherein the fourth terminal is operatively coupled to the first terminal, the third terminal receives the pulse width modulated signal, and the fifth terminal provides the second switch control signal;

a second NOT gate having a sixth terminal and seventh terminal, wherein the sixth terminal is operatively coupled to the third terminal and the seventh terminal provides the third switch control signal; and a second AND gate having an eighth terminal, a ninth terminal, and a tenth terminal, wherein the eight terminal is operatively coupled to the third terminal, the ninth terminal is operatively coupled to the second terminal, and the tenth terminal provides the first switch control signal.

8. An apparatus, comprising:

a power converter that generates a power converter output voltage in response to a first switch control signal, a second switch control signal, and a third switch control signal, the power converter comprising:

a first switch that is responsive to the first switch control signal;

a second switch that is responsive to the second switch control signal;

a third switch that is responsive to the third switch control signal;

a controller that generates the first switch control signal, the second switch control signal, and the third switch control signal based on a boost converter output voltage, a battery voltage, a switching voltage, a reference voltage, and a clock signal, the controller comprising:

an error amplifier that generates an error amplifier signal in response to the boost converter output voltage, the battery voltage, the switching voltage, the reference voltage, and a mode signal;

a pulse width modulation generator that generates a pulse width modulated signal in response to the error amplifier signal and the clock signal; and a mode selector that generates the mode signal, the first switch control signal, the second switch control signal, and the third switch control signal in response to the pulse width modulated signal, the reference voltage, and the battery voltage, the mode selector comprising:

a first buffer that receives the reference voltage;

a second buffer that receives the battery voltage;

a first comparator with hysteresis having a first input terminal coupled to a first buffer output terminal of the first buffer and a second input terminal coupled to a second buffer output terminal of the second buffer;

a first NOT gate having a first terminal and a second terminal, wherein the first terminal is coupled to a comparator output terminal of the comparator with hysteresis;

a first AND gate having a third terminal, a fourth terminal, and a fifth terminal, wherein the fourth terminal is coupled to the first terminal, the third terminal receives the pulse width modulated signal, and the fifth terminal provides the second switch control signal;

a second NOT gate having a sixth terminal and seventh terminal, wherein the sixth terminal is coupled to the third terminal and the seventh terminal provides the third switch control signal; and a second AND gate having an eighth terminal, a ninth terminal, and a tenth terminal, wherein the eight terminal is coupled to the third terminal, the ninth terminal is coupled to the second terminal, and the tenth terminal provides the first switch control signal; and an RF power amplifier that generates a fourth generation mobile phone signal in response to an RF input signal and the power converter output voltage.

9. The apparatus of claim 8 wherein the error amplifier comprises:

an operational amplifier that has an eleventh terminal, a twelfth terminal, and a thirteenth terminal, wherein the third terminal provides the error amplifier signal;

a first capacitor having a fourteenth terminal and a fifteenth terminal, wherein the fourteenth terminal is connected to the eleventh terminal and the fifteenth terminal is connected to the thirteenth terminal;

a second capacitor having a sixteenth terminal and a seventeenth terminal, wherein the sixteenth terminal is connected to the twelfth terminal and the seventeenth terminal is connected to ground;

a first resistor having an eighteenth terminal and a nineteenth terminal, wherein the nineteenth terminal is connected to the fourteenth terminal;

a second resistor having a twentieth terminal and a twenty-first terminal, wherein the twentieth terminal receives the switching voltage and the twenty-first terminal is connected to the eleventh terminal;

a third resistor having a twenty-second terminal and a twenty-third terminal, wherein the twenty-second terminal receives the reference voltage and the twenty-third terminal is connected to the twelfth terminal;

a fourth resistor having a twenty-fourth terminal and a twenty-fifth terminal, wherein the twenty-fifth terminal is connected to the twelfth terminal;

a third NOT gate having a twenty-sixth terminal and a twenty-seventh terminal, wherein the twenty-sixth terminal receives the mode signal;

a fourth NOT gate having a twenty-eighth terminal, a twenty-ninth terminal, a first power terminal, and a second power terminal, wherein the twenty-eighth terminal receives the clock signal, the twenty-ninth terminal is connected to the eighteenth terminal, and the second power terminal is connected to ground;

a fifth NOT gate having a thirtieth terminal, a thirty-first terminal, a third power terminal, and a fourth power terminal, wherein the thirtieth terminal is connected to the twenty-ninth terminal, the thirty-first terminal is connected to the twenty-fourth terminal, and the fourth power terminal is connected to ground;

a fourth switch having a thirty-second terminal, a thirty-third terminal, and a first enable terminal, wherein the thirty-second terminal is connected to the first power terminal, the thirty-third terminal is connected to the battery voltage, and the first enable terminal is connected to the twenty-seventh terminal; and a fifth switch having a thirty-fourth terminal, a thirty-fifth terminal, and a second enable terminal, wherein the thirty-fourth terminal is connected to the third power terminal and the thirty-second terminal, the thirty-fifth terminal is connected to the boost converter output voltage, and the second enable terminal is connected to the twenty-sixth terminal.

10. The apparatus of claim 8 wherein the pulse width modulation generator comprises:

a second comparator having an eleventh terminal, a twelfth terminal, and a thirteenth terminal, wherein the eleventh terminal receives the error amplifier signal and the twelfth terminal is connected to a predetermined voltage;

a sixth NOT gate having a fourteenth terminal and a fifteenth terminal, wherein the fourteenth terminal receives the clock signal;

a seventh NOT gate having a sixteenth terminal and a seventeenth terminal, wherein the sixteenth terminal is connected to the thirteenth terminal;

a third AND gate having an eighteenth terminal, a nineteenth terminal, and a twentieth terminal, wherein the eighteenth terminal is connected to the thirteenth terminal and the nineteenth terminal is connected to the fifteenth terminal;

a fourth AND gate having a twenty-first terminal, a twenty-second terminal, and a twenty-third terminal, wherein the twenty-first terminal is connected to the fourteenth terminal and the twenty-second terminal is connected to the seventeenth terminal; and a set-reset latch having a twenty-fourth terminal, a twenty-fifth terminal, and a twenty-sixth terminal, wherein the twenty-fourth terminal is connected to the twentieth terminal, the twenty-fifth terminal is connected to the twenty-third terminal, and the twenty-sixth terminal provides the pulse width modulated signal.

11. An apparatus, comprising:

a power converter that generates a power converter output voltage in response to a first switch control signal, a second switch control signal, and a third switch control signal, the power converter comprising:

a first switch that is responsive to the first switch control signal;

a second switch that is responsive to the second switch control signal;

a third switch that is responsive to the third switch control signal;

a controller that generates the first switch control signal, the second switch control signal, and the third switch control signal based on a boost converter output voltage, a battery voltage, a switching voltage, a reference voltage, and a clock signal, the controller comprising:

an error amplifier that generates an error amplifier signal in response to the boost converter output voltage, the battery voltage, the switching voltage, the reference voltage, and a mode signal, the error amplifier comprising;

an operational amplifier having an eleventh terminal, a twelfth terminal, and a thirteenth terminal, wherein the thirteenth terminal provides the error amplifier signal;

a first capacitor having a fourteenth terminal and a fifteenth terminal, wherein the fourteenth terminal is connected to the eleventh terminal and the fifteenth terminal is connected to the thirteenth terminal;

a second capacitor having a sixteenth terminal and a seventeenth terminal, wherein the sixteenth terminal is connected to the twelfth terminal and the seventeenth terminal is connected to ground;

a first resistor having an eighteenth terminal and a nineteenth terminal, wherein the nineteenth terminal is connected to the fourteenth terminal;

a second resistor having a twentieth terminal and a twenty-first terminal, wherein the twentieth terminal receives the switching voltage and the twenty-first terminal is connected to the eleventh terminal;

a third resistor having a twenty-second terminal and a twenty-third terminal, wherein the twenty-second terminal receives the reference voltage and the twenty-third terminal is connected to the twelfth terminal;

a fourth resistor having a twenty-fourth terminal and a twenty-fifth terminal, wherein the twenty-fifth terminal is connected to the twelfth terminal;

a first NOT gate having a twenty-sixth terminal and a twenty-seventh terminal, wherein the twenty-sixth terminal receives the mode signal;

a second NOT gate having a twenty-eighth terminal, a twenty-ninth terminal, a first power terminal, and a second power terminal, wherein the twenty-eighth terminal receives the clock signal, the twenty-ninth terminal is connected to the eighteenth terminal, and the second power terminal is connected to ground;

a third NOT gate having a thirtieth terminal, a thirty-first terminal, a third power terminal, and a fourth power terminal, wherein the thirtieth terminal is connected to the twenty-ninth terminal, the thirty-first terminal is connected to the twenty-fourth terminal, and the fourth power terminal is connected to ground;

a fourth switch having a thirty-second terminal, a thirty-third terminal, and a first enable terminal, wherein the thirty-second terminal is connected to the first power terminal, the thirty-third terminal is connected to the battery voltage, and the first enable terminal is connected to the twenty-seventh terminal; and a fifth switch having a thirty-fourth terminal, a thirty-fifth terminal, and a second enable terminal, wherein the thirty-fourth terminal is connected to the third power terminal and the thirty-second terminal, the thirty-fifth terminal is connected to the boost converter output voltage, and the second enable terminal is connected to the twenty-sixth terminal;

a pulse width modulation generator that generates a pulse width modulated signal in response to the error amplifier signal and the clock signal; and a mode selector that generates the mode signal, the first switch control signal, the second switch control signal, and the third switch control signal in response to the pulse width modulated signal, the reference voltage, and the battery voltage, the mode selector comprising:

a first buffer that receives the reference voltage;

a second buffer that receives the battery voltage;

a first comparator with hysteresis having a first input terminal coupled to a first buffer output terminal of the first buffer and a second input terminal coupled to a second buffer output terminal of the second buffer;

a fifth NOT gate having a first terminal and a second terminal, wherein the first terminal is coupled to a comparator output terminal of the comparator with hysteresis;

a first AND gate having a third terminal, a fourth terminal, and a fifth terminal, wherein the fourth terminal is coupled to the first terminal, the third terminal receives the pulse width modulated signal, and the fifth terminal provides the second switch control signal;

a sixth NOT gate having a sixth terminal and seventh terminal, wherein the sixth terminal is coupled to the third terminal and the seventh terminal provides the third switch control signal; and a second AND gate having an eighth terminal, a ninth terminal, and a tenth terminal, wherein the eight terminal is coupled to the third terminal, the ninth terminal is coupled to the second terminal, and the tenth terminal provides the first switch control signal; and an RF power amplifier that generates a fourth generation mobile phone signal in response to an RF input signal and the power converter output voltage [175].

12. The apparatus of claim 11 wherein the pulse width modulation generator comprises:

a second comparator having a thirty-sixth terminal, a thirty-seventh terminal, and a thirty-eighth terminal, wherein the thirty-sixth terminal receives the error amplifier signal and the thirty-seventh terminal is connected to a predetermined voltage;

a seventh NOT gate having a thirty-ninth terminal and a fortieth terminal, wherein the thirty-ninth terminal receives the clock signal;

an eighth NOT gate having a forty-first terminal and a forty-second terminal, wherein the forty-first terminal is connected to the thirty-eighth terminal;

a third AND gate having an forty-third terminal, a forty-fourth terminal, and a forty-fifth terminal, wherein the forty-third terminal is connected to the thirty-eighth terminal and the forty-forth terminal is connected to the fortieth terminal;

a fourth AND gate having a forty-sixth terminal, a forty-seventh terminal, and a forty-eighth terminal, wherein the forty-sixth terminal is connected to the thirty-eighth terminal and the forty-seventh terminal is connected to the forty-second terminal; and a set-reset latch having a forty-ninth terminal, a fiftieth terminal, and a fifty-first terminal, wherein the forty-ninth terminal is connected to the forty-fifth terminal, the fiftieth terminal is connected to the forty-eighth terminal, and the fifty-first terminal provides the pulse width modulated signal.

* * * * *

UNITED STATES PATENT AND TRADEMARK OFFICE
CERTIFICATE OF CORRECTION

PATENT NO.       : 9,667,196 B2                                   Page 1 of 1
APPLICATION NO.  : 13/407506
DATED            : May 30, 2017
INVENTOR(S)      : Pallab Midya It is certified that error appears in the above-identified patent and that said Letters Patent is hereby corrected as shown below:

On the Title Page

In Item (73) Assignee:
Change "ADX Research, Inc., Schaumberg, IL" to --Tagore Technology, Inc., Arlington Heights, IL--

Signed and Sealed this
Twenty-fifth Day of July, 2017

Joseph Matal
*Performing the Functions and Duties of the*
*Under Secretary of Commerce for Intellectual Property and*
*Director of the United States Patent and Trademark Office*